US012283959B2

(12) United States Patent
Hu

(10) Patent No.: US 12,283,959 B2
(45) Date of Patent: Apr. 22, 2025

(54) SIGNAL CONDITIONING CIRCUIT AND MEASUREMENT DEVICE

(71) Applicant: EVE ENERGY CO., LTD., Huizhou (CN)

(72) Inventor: Jun Hu, Huizhou (CN)

(73) Assignee: EVE ENERGY CO., LTD., Huizhou (CN)

( * ) Notice: Subject to any disclaimer, the term of this patent is extended or adjusted under 35 U.S.C. 154(b) by 73 days.

(21) Appl. No.: 18/127,005

(22) Filed: Mar. 28, 2023

(65) Prior Publication Data

US 2024/0128961 A1 Apr. 18, 2024

(30) Foreign Application Priority Data

Oct. 13, 2022 (CN) .......................... 202211257754.6
Oct. 13, 2022 (CN) .......................... 202222691927.7

(51) Int. Cl.
*H03K 5/08* (2006.01)
*H03F 3/45* (2006.01)
*H03K 5/02* (2006.01)

(52) U.S. Cl.
CPC ......... *H03K 5/084* (2013.01); *H03F 3/45475* (2013.01); *H03K 5/02* (2013.01)

(58) Field of Classification Search
CPC ..................................................... H03K 5/084

USPC ............................................................ 327/72
See application file for complete search history.

(56) References Cited

U.S. PATENT DOCUMENTS

2020/0389041 A1* 12/2020 Li ......................... H02J 7/0016

OTHER PUBLICATIONS

Colli-Menchi Adrian I et al:"A High-Efficiency Self-Oscillating Class-D Amplifier for Piezoelectric Speakers", IEEE Transactions On Power Electronics, Institute of Electrical and Electronics Engineers, USA, vol. 30, No. 9, Sep. 2015 (Sep. 2015), pp. 5125-5135, XP011578658, ISSN 0885-8993, DOI:10. 1109/TPEL.2014. 2363406; Issue Dated Apr. 15, 2015.

* cited by examiner

*Primary Examiner* — Tomi Skibinski

(57) ABSTRACT

A signal conditioning circuit and a measurement device are provided. A selection circuit of the signal conditioning circuit outputs a first conduction signal when a voltage value of an input voltage signal is less than a threshold value of a voltage threshold signal, such that a first segmented voltage conditioning sub-circuit conditions, based on the received first conduction signal, the input voltage signal and outputs a first output voltage signal. The selection circuit outputs a second conduction signal when the voltage value of the input voltage signal is greater than the threshold value of the voltage threshold signal, such that the second segmented voltage conditioning sub-circuit conditions the input voltage signal and outputs a second output voltage signal.

20 Claims, 4 Drawing Sheets

SIGNAL CONDITIONING CIRCUIT AND MEASUREMENT DEVICE

CROSS REFERENCE TO RELATED APPLICATIONS

The present application claims priority of Chinese Patent Application 202222691927.7, filed on Oct. 13, 2022, and priority of Chinese Patent Application 202211257754.6, filed on Oct. 13, 2022, in the China National Intellectual Property Administration, the entire contents of which are hereby incorporated by reference in their entireties.

TECHNICAL FIELD

The present disclosure relates to the field of signal conditioning, and in particular to a signal conditioning circuit and a measurement device.

BACKGROUND

A signal conditioning circuit is a circuit that converts an analogue signal into a digital signal that can be used for data acquisition, controlling processes, executing computations, displaying readouts, and so on. Sampling and conditioning a voltage signal is main components of the signal conditioning circuit.

While performing voltage sampling in practice, a range of an input voltage is significantly large. When the input voltage is relatively large, the input voltage may exceed a range of a sampling circuit. When the input voltage is small, sampling accuracy may be insufficient, or no data can be sampled. Usually, a fixed amplification multiple may be applied to amplify the input voltage. The sampling accuracy may be low, and a voltage cannot be conditioned continuously. When a microcontroller is configured to control segmented sampling, the circuit may be complex and costly.

SUMMARY OF THE DISCLOSURE

Therefore, a segmented selectable signal conditioning circuit and a measurement device are provided to solve the problem in the voltage sampling and conditioning methods as mentioned in the above, such that an applicable sampling range of voltage sampling and conditioning may be increased, segmented voltage may be conditioned continuously, accuracy of sampling may be improved, and scenarios that voltage sampling circuits can be applied may be increased.

According to a first aspect, a signal conditioning circuit is provided and includes: a voltage threshold circuit, configured to output a voltage threshold signal; a selection circuit, connected to the voltage threshold circuit and configured to receive an input voltage signal and the voltage threshold signal, output a first conduction signal in response to a voltage value of the input voltage signal is less than a threshold value of the voltage threshold signal, and output a second conduction signal in response to the voltage value of the input voltage signal is greater than the threshold value of the voltage threshold signal; and a segmented voltage conditioning circuit, comprising a first segmented voltage conditioning sub-circuit and a second segmented voltage conditioning sub-circuit, the first segmented voltage conditioning sub-circuit being configured to condition the input voltage signal to output a first output voltage signal based on the first conduction signal, and the second segmented voltage conditioning sub-circuit being configured to condition the input voltage signal to output a second output voltage signal based on the second conduction signal.

According to a second aspect, a signal measurement device is provided and includes: a signal conditioning circuit. The signal conditioning circuit includes: a voltage threshold circuit, configured to output a voltage threshold signal; a selection circuit, connected to the voltage threshold circuit and configured to receive an input voltage signal and the voltage threshold signal, output a first conduction signal in response to a voltage value of the input voltage signal is less than a threshold value of the voltage threshold signal, and output a second conduction signal in response to the voltage value of the input voltage signal is greater than the threshold value of the voltage threshold signal; and a segmented voltage conditioning circuit, comprising a first segmented voltage conditioning sub-circuit and a second segmented voltage conditioning sub-circuit, the first segmented voltage conditioning sub-circuit being configured to condition the input voltage signal to output a first output voltage signal based on the first conduction signal, and the second segmented voltage conditioning sub-circuit being configured to condition the input voltage signal to output a second output voltage signal based on the second conduction signal.

According to a third aspect, a signal conditioning circuit is provided and includes: a voltage threshold circuit, configured to output a voltage threshold signal; a selection circuit, connected to the voltage threshold circuit and configured to receive an input voltage signal and the voltage threshold signal, output a first conduction signal in response to a voltage value of the input voltage signal is less than a threshold value of the voltage threshold signal, and output a second conduction signal in response to the voltage value of the input voltage signal is greater than the threshold value of the voltage threshold signal; a first segmented voltage conditioning sub-circuit, configured to condition the input voltage signal to output a first output voltage signal based on the first conduction signal; and a second segmented voltage conditioning sub-circuit, configured to condition the input voltage signal to output a second output voltage signal based on the second conduction signal.

Figure 1:
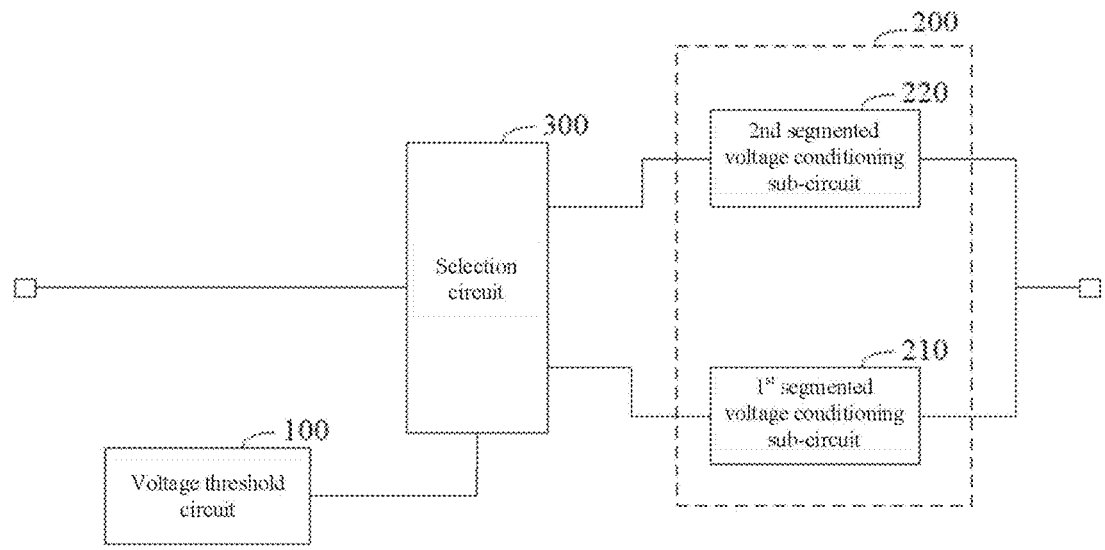
FIG. 1 is a first structural schematic view of a signal conditioning circuit according to an embodiment of the present disclosure.

Reference numerals in the drawings voltage threshold circuit 100; segmented voltage conditioning circuit 200; first segmented voltage conditioning sub-circuit 210; first proportional operational amplifier sub-circuit 212; first voltage following sub-circuit 214; second segmented voltage conditioning sub-circuit 220; second proportional operational amplifier sub-circuit 222; first differential amplifier sub-circuit 224; continuously-output conditioning circuit 226; second voltage following sub-circuit 228; selection circuit 300; first comparator B1; second comparator B2; first switching tube Q1; second switching tube Q2; first resistor R1; second resistor R2; third resistor R3; fourth resistor R4; fifth resistor R5; sixth resistor R6; seventh resistor R7; eighth resistor R8; ninth resistor R9; tenth resistor R10; eleventh resistor R11; twelfth resistor R12.

DETAILED DESCRIPTION

In order to enable any ordinary skilled person in the art to understand the present disclosure better, technical solutions in the embodiments of the present disclosure will be described clearly and completely below by referring to the accompanying drawings in the embodiments of the present disclosure. Apparently, the described embodiments are only a part of but not all of the embodiments of the present disclosure. All other embodiments obtained by any ordinary skilled person in the art based on the embodiments of the present disclosure without creative work shall fall within the scope of the present disclosure.

To noted that the terms "first", "second", and so on, in the specification, claims, and the accompanying drawings of the present disclosure are used to distinguish similar objects and shall not be interpreted as describing a particular order or sequence. It shall be understood that the data described by the terms are interchangeable, where appropriate, for the purposes of the embodiments of the present disclosure. Furthermore, the terms "include", "have", and any variation thereof, are used to cover non-exclusive inclusion. For example, a process, a method, a system, a product or an apparatus including a series of operations or units need not be limited to those operations or units that are clearly listed, but may include those that are not explicitly listed or inherently included in the process, the method, the system, the product or the apparatus.

In addition, the term "plurality" shall have the meaning of two and more than two.

According to the present disclosure, a signal conditioning circuit is provided and includes: a voltage threshold circuit, a selection circuit, and a segmented voltage conditioning circuit. The voltage threshold circuit is configured to output a voltage threshold signal. The selection circuit is connected to the voltage threshold circuit and configured to receive an input voltage signal and the voltage threshold signal, output a first conduction signal in response to a voltage value of the input voltage signal is less than a threshold value of the voltage threshold signal, and output a second conduction signal in response to the voltage value of the input voltage signal is greater than the threshold value of the voltage threshold signal. The segmented voltage conditioning circuit is connected to the selection circuit and includes a first segmented voltage conditioning sub-circuit and a second segmented voltage conditioning sub-circuit, the first segmented voltage conditioning sub-circuit being configured to condition the input voltage signal to output a first output voltage signal based on the first conduction signal, and the second segmented voltage conditioning sub-circuit being configured to condition the input voltage signal to output a second output voltage signal based on the second conduction signal.

In some embodiments, the first segmented voltage conditioning sub-circuit includes a first switching tube and a first proportional operational amplifier sub-circuit, wherein a gate of the first switching tube is connected to the selection circuit, a source of the first switching tube is connected to an input terminal of the first proportional operational amplifier sub-circuit, and an output terminal of the first proportional operational amplifier sub-circuit is configured to output a first proportional amplified voltage signal. The second segmented voltage conditioning sub-circuit includes a second switching tube and a second proportional operational amplifier sub-circuit, wherein a gate of the second switching tube is connected to the selection circuit, a source of the second switching tube is connected to an input terminal of the second proportional operational amplifier sub-circuit, and an output terminal of the second proportional operational amplifier sub-circuit is configured to output a second proportional amplified voltage signal.

In some embodiments, the second segmented voltage conditioning sub-circuit further includes a differential amplifier sub-circuit and a continuously-output conditioning circuit, wherein a first input terminal of the differential amplifier sub-circuit is connected to the output terminal of the second proportional operational amplifier sub-circuit, a second input terminal of the differential amplifier sub-circuit is connected to the continuously-output conditioning circuit, and an output terminal of the differential amplifier sub-circuit is configured to output a conditioned second proportional amplification voltage signal which is obtained as the second proportional amplification voltage signal is conditioned.

In some embodiments, the first proportional operational amplifier sub-circuit includes a first proportional operational amplifier, a fifth resistor, and a sixth resistor, wherein a positive input terminal of the first proportional operational amplifier is used as the input terminal of the first proportional operational amplifier sub-circuit, a negative input terminal of the first proportional operational amplifier is connected to one terminal of the fifth resistor and one terminal of the sixth resistor, another terminal of the fifth resistor is grounded, and another terminal of the sixth resistor is connected to an output terminal of the first proportional operational amplifier. The second proportional operational amplifier sub-circuit includes a second proportional operational amplifier, a seventh resistor, and an eighth resistor, wherein a positive input terminal of the second proportional operational amplifier is used as the input terminal of the second proportional operational amplifier sub-circuit, a negative input terminal of the second proportional operational amplifier is connected to one terminal of the seventh resistor and one terminal of the eighth resistor, another terminal of the seventh resistor is grounded, and another terminal of the eighth resistor is connected to an output terminal of the second proportional operational amplifier.

In some embodiments, the continuously-output conditioning circuit includes a third resistor and a fourth resistor which are series-connected, one end of the series-connected third resistor and the fourth resistor is connected to a DC power supply and another end of the series-connected third resistor and the fourth resistor is grounded. The differential amplifier sub-circuit includes a differential amplifier, a ninth resistor, a tenth resistor, an eleventh resistor, and a twelfth resistor, wherein a positive input terminal of the differential amplifier is connected to one terminal of the ninth resistor and one terminal of the tenth resistor, another terminal of the ninth resistor is connected to the output terminal of the second proportional operational amplifier sub-circuit, another terminal of the tenth resistor is grounded, a negative input terminal of the differential amplifier is connected to one terminal of the eleventh resistor and one terminal of the twelfth resistor, another terminal of the eleventh resistor is connected between the third resistor and the fourth resistor, and another terminal of the twelfth resistor is connected to an output terminal of the differential amplifier.

In some embodiments, the ninth resistor, the tenth resistor, the eleventh resistor, and the twelfth resistor have the same resistor value.

In some embodiments, the voltage threshold circuit includes a first resistor and a second resistor which are series-connected, wherein one end of the series-connected first resistor and the second resistor is connected to a DC power supply and another end of the series-connected first resistor and the second resistor is grounded.

In some embodiments, the selection circuit includes a first comparator and a second comparator. A first input terminal of the first comparator is used to receive the input voltage signal, a second input terminal of the first comparator is connected to the voltage threshold circuit to receive the voltage threshold signal, an output terminal of the first comparator is connected to the first segmented voltage conditioning sub-circuit. A first input terminal of the second comparator is connected to the voltage threshold circuit to receive the voltage threshold signal, a second input terminal of the second comparator is used to receive the input voltage signal, and an output terminal of the second comparator is connected to the second segmented voltage conditioning sub-circuit.

In some embodiments, the first segmented voltage conditioning sub-circuit further includes a first voltage following sub-circuit, wherein a positive input terminal of the first voltage following sub-circuit is connected to the output terminal of the first proportional operational amplifier sub-circuit, and a negative input terminal of the first voltage following sub-circuit is connected to the output terminal of the first voltage following sub-circuit. The second segmented voltage conditioning sub-circuit further includes a second voltage following sub-circuit, wherein a positive input terminal of the second voltage following sub-circuit is connected to the output terminal of the second proportional operational amplifier sub-circuit, and a negative input terminal of the second voltage following sub-circuit is connected to the output terminal of the second voltage following sub-circuit.

According to the present disclosure, a signal measurement device is provided and includes a signal conditioning circuit. The signal conditioning circuit includes a voltage threshold circuit, a selection circuit, and a segmented voltage conditioning circuit. The voltage threshold circuit is configured to output a voltage threshold signal. The selection circuit is connected to the voltage threshold circuit and configured to receive an input voltage signal and the voltage threshold signal, output a first conduction signal in response to a voltage value of the input voltage signal is less than a threshold value of the voltage threshold signal, and output a second conduction signal in response to the voltage value of the input voltage signal is greater than the threshold value of the voltage threshold signal. The segmented voltage conditioning circuit includes a first segmented voltage conditioning sub-circuit and a second segmented voltage conditioning sub-circuit, the first segmented voltage conditioning sub-circuit being configured to condition the input voltage signal to output a first output voltage signal based on the first conduction signal, and the second segmented voltage conditioning sub-circuit being configured to condition the input voltage signal to output a second output voltage signal based on the second conduction signal.

In some embodiments, the first segmented voltage conditioning sub-circuit includes a first switching tube and a first proportional operational amplifier sub-circuit, wherein a gate of the first switching tube is connected to the selection circuit, a source of the first switching tube is connected to an input terminal of the first proportional operational amplifier sub-circuit, and an output terminal of the first proportional operational amplifier sub-circuit is configured to output a first proportional amplified voltage signal. The second segmented voltage conditioning sub-circuit includes a second switching tube and a second proportional operational amplifier sub-circuit, wherein a gate of the second switching tube is connected to the selection circuit, a source of the second switching tube is connected to an input terminal of the second proportional operational amplifier sub-circuit, and an output terminal of the second proportional operational amplifier sub-circuit is configured to output a second proportional amplified voltage signal.

In some embodiments, the second segmented voltage conditioning sub-circuit further includes a differential amplifier sub-circuit and a continuously-output conditioning circuit, wherein a first input terminal of the differential amplifier sub-circuit is connected to the output terminal of the second proportional operational amplifier sub-circuit, a second input terminal of the differential amplifier sub-circuit is connected to the continuously-output conditioning circuit, and an output terminal of the differential amplifier sub-circuit is configured to output a conditioned second proportional amplification voltage signal which is obtained as the second proportional amplification voltage signal is conditioned.

In some embodiments, the first proportional operational amplifier sub-circuit includes a first proportional operational amplifier, a fifth resistor, and a sixth resistor, wherein a positive input terminal of the first proportional operational amplifier is used as the input terminal of the first proportional operational amplifier sub-circuit, a negative input terminal of the first proportional operational amplifier is connected to one terminal of the fifth resistor and one terminal of the sixth resistor, another terminal of the fifth resistor is grounded, and another terminal of the sixth resistor is connected to an output terminal of the first proportional operational amplifier. The second proportional operational amplifier sub-circuit includes a second proportional operational amplifier, a seventh resistor, and an eighth resistor, wherein a positive input terminal of the second proportional operational amplifier is used as the input terminal of the second proportional operational amplifier sub-circuit, a negative input terminal of the second proportional operational amplifier is connected to one terminal of the seventh resistor and one terminal of the eighth resistor, another terminal of the seventh resistor is grounded, and another terminal of the eighth resistor is connected to an output terminal of the second proportional operational amplifier.

In some embodiments, the continuously-output conditioning circuit includes a third resistor and a fourth resistor which are series-connected, one end of the series-connected third resistor and the fourth resistor is connected to a DC power supply and another end of the series-connected third resistor and the fourth resistor is grounded. The differential amplifier sub-circuit includes a differential amplifier, a ninth resistor, a tenth resistor, an eleventh resistor, and a twelfth resistor, wherein a positive input terminal of the differential amplifier is connected to one terminal of the ninth resistor and one terminal of the tenth resistor, another terminal of the ninth resistor is connected to the output terminal of the second proportional operational amplifier sub-circuit, another terminal of the tenth resistor is grounded, a negative input terminal of the differential amplifier is connected to one terminal of the eleventh resistor and one terminal of the twelfth resistor, another terminal of the eleventh resistor is connected between the third resistor and the fourth resistor, and another terminal of the twelfth resistor is connected to an output terminal of the differential amplifier.

In some embodiments, the ninth resistor, the tenth resistor, the eleventh resistor, and the twelfth resistor have the same resistor value.

In some embodiments, the voltage threshold circuit includes a first resistor and a second resistor which are series-connected, wherein one end of the series-connected first resistor and the second resistor is connected to a DC power supply and another end of the series-connected first resistor and the second resistor is grounded.

In some embodiments, the selection circuit includes a first comparator and a second comparator. A first input terminal of the first comparator is used to receive the input voltage signal, a second input terminal of the first comparator is connected to the voltage threshold circuit to receive the voltage threshold signal, an output terminal of the first comparator is connected to the first segmented voltage conditioning sub-circuit. A first input terminal of the second comparator is connected to the voltage threshold circuit to receive the voltage threshold signal, a second input terminal of the second comparator is used to receive the input voltage signal, and an output terminal of the second comparator is connected to the second segmented voltage conditioning sub-circuit.

In some embodiments, the first segmented voltage conditioning sub-circuit further includes a first voltage following sub-circuit, wherein a positive input terminal of the first voltage following sub-circuit is connected to the output terminal of the first proportional operational amplifier sub-circuit, and a negative input terminal of the first voltage following sub-circuit is connected to the output terminal of the first voltage following sub-circuit. The second segmented voltage conditioning sub-circuit further includes a second voltage following sub-circuit, wherein a positive input terminal of the second voltage following sub-circuit is connected to the output terminal of the second proportional operational amplifier sub-circuit, and a negative input terminal of the second voltage following sub-circuit is connected to the output terminal of the second voltage following sub-circuit.

According to the present disclosure, a signal conditioning circuit is provided and includes: a voltage threshold circuit, a selection circuit, a first segmented voltage conditioning sub-circuit, and a second segmented voltage conditioning sub-circuit. The voltage threshold circuit is configured to output a voltage threshold signal. The selection circuit is connected to the voltage threshold circuit and configured to receive an input voltage signal and the voltage threshold signal, output a first conduction signal in response to a voltage value of the input voltage signal is less than a threshold value of the voltage threshold signal, and output a second conduction signal in response to the voltage value of the input voltage signal is greater than the threshold value of the voltage threshold signal. The first segmented voltage conditioning sub-circuit, configured to condition the input voltage signal to output a first output voltage signal based on the first conduction signal. The second segmented voltage conditioning sub-circuit, configured to condition the input voltage signal to output a second output voltage signal based on the second conduction signal.

In some embodiments, the first segmented voltage conditioning circuit includes a first switching tube and a first proportional operational amplifier sub-circuit, wherein a gate of the first switching tube is connected to the selection circuit, a source of the first switching tube is connected to an input terminal of the first proportional operational amplifier sub-circuit, and an output terminal of the first proportional operational amplifier sub-circuit is configured to output a first proportional amplified voltage signal. The second segmented voltage conditioning circuit includes a second switching tube and a second proportional operational amplifier sub-circuit, wherein a gate of the second switching tube is connected to the selection circuit, a source of the second switching tube is connected to an input terminal of the second proportional operational amplifier sub-circuit, and an output terminal of the second proportional operational amplifier sub-circuit is configured to output a second proportional amplified voltage signal.

In order to solve problem of the voltage sampling and condition method in the art as mentioned in the above, in an embodiment, as shown in FIG. 1, a signal conditioning circuit is provided and includes a voltage threshold circuit 100, a segmented voltage conditioning circuit 200, and a selection circuit 300.

The voltage threshold circuit 100 is configured to output a voltage threshold signal. The segmented voltage conditioning circuit 200 includes a first segmented voltage conditioning sub-circuit 210 and a second segmented voltage conditioning sub-circuit 220. The first segmented voltage conditioning sub-circuit 210 is configured to condition an input voltage signal, based on a received first conduction signal, to output a first output voltage signal. The second segmented voltage conditioning sub-circuit 220 is configured to condition the input voltage signal, based on a received second conduction signal, to output a second output voltage signal. The selection circuit 300 is connected to the voltage threshold circuit 100, the first segmented voltage conditioning sub-circuit 210 and the second segmented voltage conditioning sub-circuit 220. The selection circuit 300 is configured to receive the input voltage signal and the voltage threshold signal. The selection circuit 300 is further configured to: output the first conduction signal in response to the voltage value of the input voltage signal being less than the threshold value of the voltage threshold signal; and output the second conduction signal in response to the voltage value of the input voltage signal being greater than the threshold value of the voltage threshold signal.

The voltage threshold circuit 100 is connected to the selection circuit 300. A resistance value may be set for the voltage threshold circuit 100, such that the voltage threshold circuit 100 may output the voltage threshold signal to the selection circuit 300. The threshold value of the first voltage threshold signal refers to a corresponding voltage threshold value. The segmented voltage conditioning circuit 200 may include 2 corresponding sub-circuits. For example, the segmented voltage conditioning circuit 200 may include the first segmented voltage conditioning sub-circuit 210 and the second segmented voltage conditioning sub-circuit 220. The first segmented voltage conditioning sub-circuit 210 may condition the input voltage signal based on a first preset amplification proportion to output a first output voltage signal. The second segmented voltage conditioning sub-circuit 220 may condition the input voltage signal based on a second preset amplification proportion to output a second output voltage signal.

The selection circuit 300 may be configured with an input interface, and the input interface may be configured to receive the input voltage signal. Since the selection circuit 300 is connected to the voltage threshold circuit 100, the selection circuit 300 may receive the input voltage signal and the voltage threshold signal and compare the input voltage signal with the voltage threshold signal. Further, the selection circuit 300 may output, based on a comparison result, the first conduction signal to the first segmented voltage conditioning sub-circuit 210 in response to the value of the input voltage signal being less than the threshold value of the voltage threshold signal, such that the first segmented voltage conditioning sub-circuit 210 may condition, based on the received first conduction signal, the input voltage signal and output the first output voltage signal. The selection circuit 300 may output the second conduction signal in response to the value of the input voltage signal being greater than the threshold value of the voltage threshold signal, such that the second segment voltage conditioning sub-circuit 220 may condition the input voltage signal, based on the received second conduction signal, and output the second output voltage signal. In this way, the voltage signal, which is segmented into two segments, may be conditioned based on the signal conditioning channel having set segmented voltage ranges.

In the above embodiment, the voltage threshold circuit 100, the segmented voltage conditioning circuit 200, and the selection circuit 300 are arranged. The segmented voltage conditioning circuit 200 is set to have 2 sub-circuits (the first segmented voltage conditioning sub-circuit 210 and the second segmented voltage conditioning sub-circuit 220). Voltage signal conditioning is optimized, the voltage may be automatically segmented and conditioned, and he circuit may be flexibly applied, such that the segmented voltage may be conditioned continuously. Different gains may be applied for different segments of the voltage, the applicable sampling range of the voltage sample conditioning may be increased, sampling accuracy and universality may be improved, the scenarios that voltage sample conditioning can be applied may be increased, universality of the circuit and the accuracy of the sample conditioning may be improved, and a cost of the circuit may be reduced.

Figure 2:
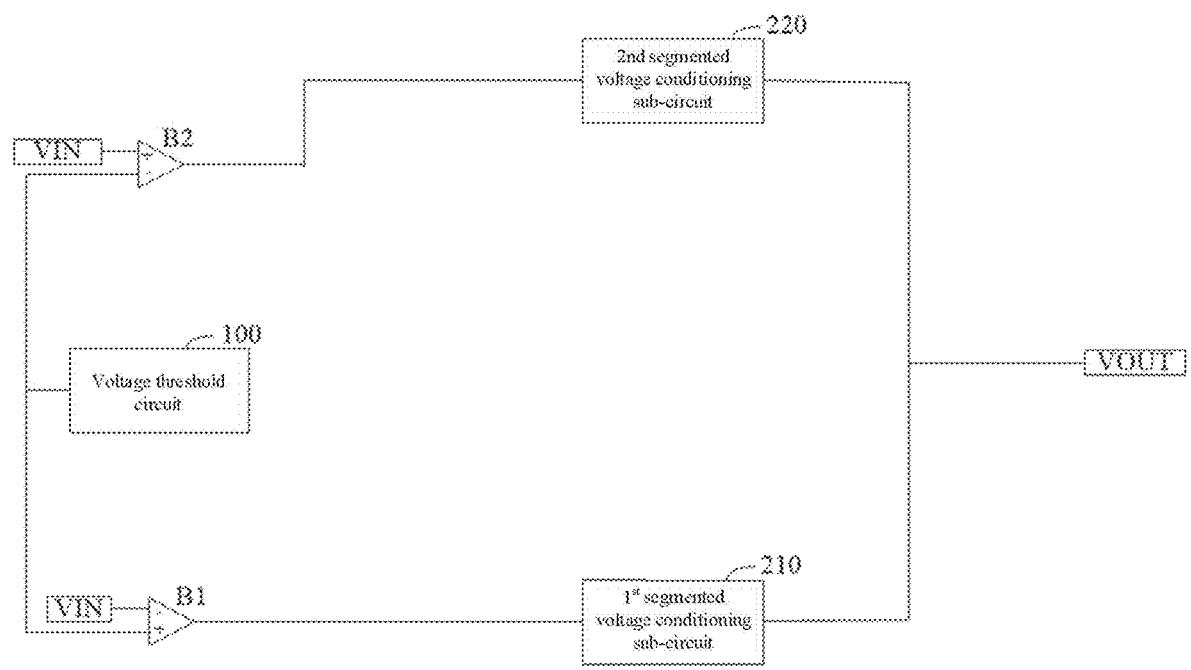
FIG. 2 is a second structural schematic view of a signal conditioning circuit according to an embodiment of the present disclosure.

In an embodiment, as shown in FIG. 2, the selection circuit 300 includes a first comparator B1 and a second comparator B2

A first input terminal of the first comparator B1 is configured to receive the input voltage signal, a second input terminal of the first comparator B1 is connected to an output terminal of the voltage threshold circuit 100, and an output terminal of the first comparator B1 is connected to the first segment voltage conditioning sub-circuit 210. A power supply terminal of the voltage threshold circuit 100 is configured to connect to a direct current power supply. A first input terminal of the second comparator B2 is connected to the output terminal of the voltage threshold circuit 100, a second input terminal of the second comparator B2 is configured to receive the input voltage signal, and an output terminal of the second comparator B2 is connected to the second segment voltage conditioning sub-circuit 220.

Each of the first comparator B1 and the second comparator B2 may be an operational comparator.

For example, in the following illustration, each of the first comparator B1 and the second comparator B2 may be the operational comparator. The first input terminal of the first comparator B1 refers to an inverting input terminal of the first comparator B1, and the second input terminal of the first comparator B1 refers to an in-phase input terminal of the first comparator B1. The first input terminal of the second comparator B2 refers to an inverting input terminal of the second comparator B2, and the second input terminal of the second comparator B2 refers to an in-phase input terminal of the second comparator B2.

Since the power supply terminal of the voltage threshold circuit 100 is connected to the direct current power supply, the voltage threshold circuit 100 may divide a voltage of the direct current power supply to output the voltage threshold signal. Since the first input terminal of the first comparator B1 receive the input voltage signal, the second input terminal of the first comparator B1 receives the voltage threshold signal, the first comparator B1 compares the voltage value of the input voltage signal to the voltage value of the first voltage threshold signal. In response to the voltage value of the input voltage signal being greater than the voltage value of the voltage threshold signal, the first segmented voltage conditioning sub-circuit 210 is disconnected. In response to the voltage value of the input voltage signal being less than the voltage value of the voltage threshold signal, the first comparator B1 transmits the first conduction signal to the first segment voltage conditioning sub-circuit 210, such that the first segment voltage conditioning sub-circuit 210 conditions the input voltage signal based on the received first conduction signal to output the first output voltage signal. Exemplarily, the first conduction signal may be a high voltage level signal. For example, the first comparator B1 transmits a low voltage level signal to the first voltage conditioning sub-circuit 210 in response to the voltage value of the input voltage signal being greater than the voltage value of the voltage threshold signal, such that the first voltage conditioning sub-circuit 210 remains being disconnected. The first comparator B1 transmits a high voltage level signal to the first voltage conditioning sub-circuit 210 in response to the voltage value of the input voltage signal being less than the voltage value of the voltage threshold signal, such that the first voltage conditioning sub-circuit 210 is conducted and is operating.

Since the first input terminal of the second comparator B2 receives the voltage threshold signal, and the second input terminal of the second comparator B2 receives the input voltage signal, the second comparator B2 compares the voltage value of the input voltage signal to the voltage value of the voltage threshold signal. In response to the voltage value of the input voltage signal being less than the voltage value of the voltage threshold signal, the second segmented voltage regulation sub-circuit 220 is disconnected. The second comparator B2 transmits the second conduction signal to the second segmented voltage conditioning sub-circuit 220 in response to the voltage value of the input voltage signal being greater than the voltage value of the voltage threshold signal, such that the second segmented voltage conditioning sub-circuit 220 conditions the input voltage signal based on the received second conduction signal to output the second output voltage signal. Exemplarily, the second conduction signal may be a high voltage level signal. For example, the second comparator B2 transmits the low voltage level signal to the second segment voltage conditioning sub-circuit 220 in response the voltage value of the input voltage signal being less than the voltage value of the voltage threshold signal, such that the second segment voltage conditioning sub-circuit 220 remains disconnected. In response to the voltage value of the input voltage signal being greater than the voltage value of the voltage threshold signal, the second comparator B2 transmits the high voltage level signal to the second segment voltage conditioning sub-circuit 220, such that the second segment voltage conditioning sub-circuit 220 is conducted and operating.

In the above embodiment, the voltage threshold circuit 100, the segmented voltage conditioning circuit 200, and the selection circuit 300. The selection circuit 300 includes the first comparator B1 and the second comparator B2. The input voltage signal is compared and processed by defining two input voltage ranges. When the voltage value of the input voltage signal falls into a corresponding input voltage range, the voltage conditioning sub-circuit corresponding to the range (the first voltage conditioning sub-circuit and the second voltage conditioning sub-circuit) is conducted, such that a broad range of voltages may be conditioned, and the voltage may be conditioned accurately. In the present disclosure, the voltage signal conditioning is optimized, the voltage is automatically segmented and conditioned. The circuit may be flexibly adapted, allowing segmented voltage to be conditioned continuously. Different gains may be applied for different segments of the voltage, the applicable sampling range of the voltage sample conditioning may be increased, sampling accuracy and universality may be improved, the scenarios that voltage sample conditioning can be applied may be increased, universality of the circuit and the accuracy of the sample conditioning may be improved, and a cost of the circuit may be reduced.

Figure 3:
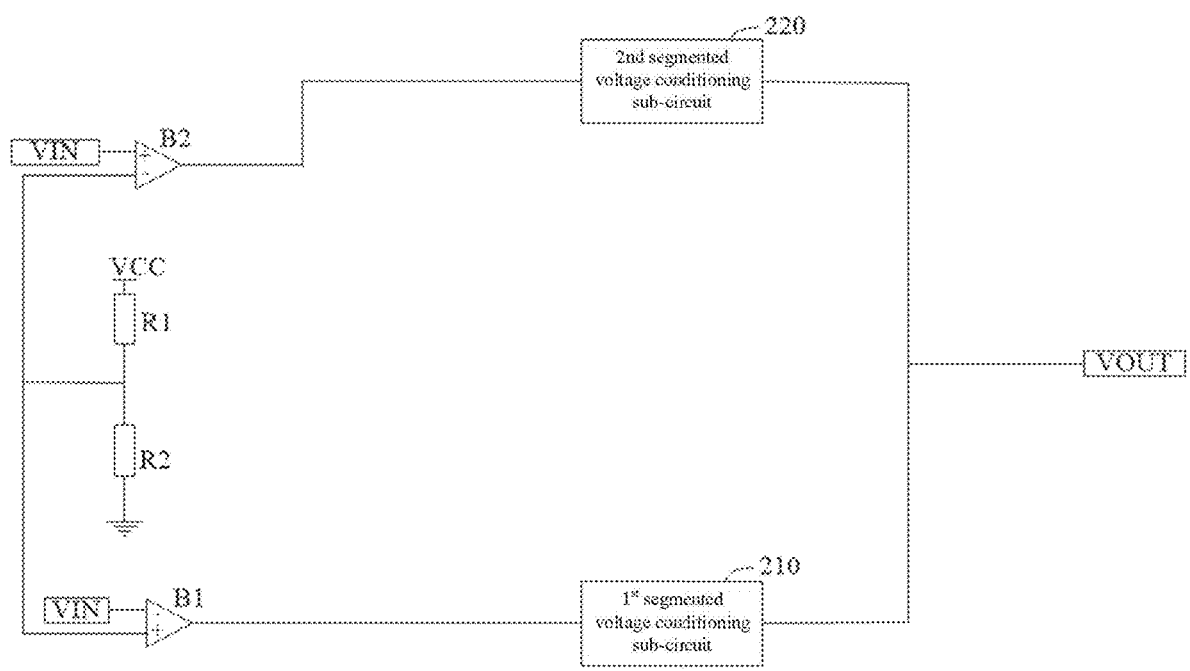
FIG. 3 is a third structural schematic view of a signal conditioning circuit according to an embodiment of the present disclosure.

In an example, as shown in FIG. 3, the voltage threshold circuit 100 includes a first resistor R1 and a second resistor R2. A first terminal of the first resistor R1 is connected to the direct current power supply, a second terminal of the first resistor R1 is connected to a first terminal of the second resistor R2. A second terminal of the second resistor R2 is connected to the ground. The second input terminal of the first comparator B1 and the first input terminal of the second comparator B2 are connected between the second terminal of the first resistor R1 and the first terminal of the second resistor R2.

Due to the connection between the first resistor R1 and the second resistor R2, when a resistance value of the first resistor R1 is r1, a resistance value of the second resistor R2 is r2, and a voltage value of the direct current power supply is vcc, the voltage threshold value of the voltage threshold signal of the voltage threshold circuit 100 is:

$$VTH1 = \frac{r2}{(r1 + r2)} VCC.$$

Exemplarily, each of the first resistor R1 and the second resistor R2 may be an adjustable resistor.

Based on the voltage threshold value set for the voltage threshold circuit 100, a detection range of the input voltage (VIN) may be divided into two ranges as follows: a first range is VIN<VTH1 and a second range is VIN>VTH1.

Figure 4:
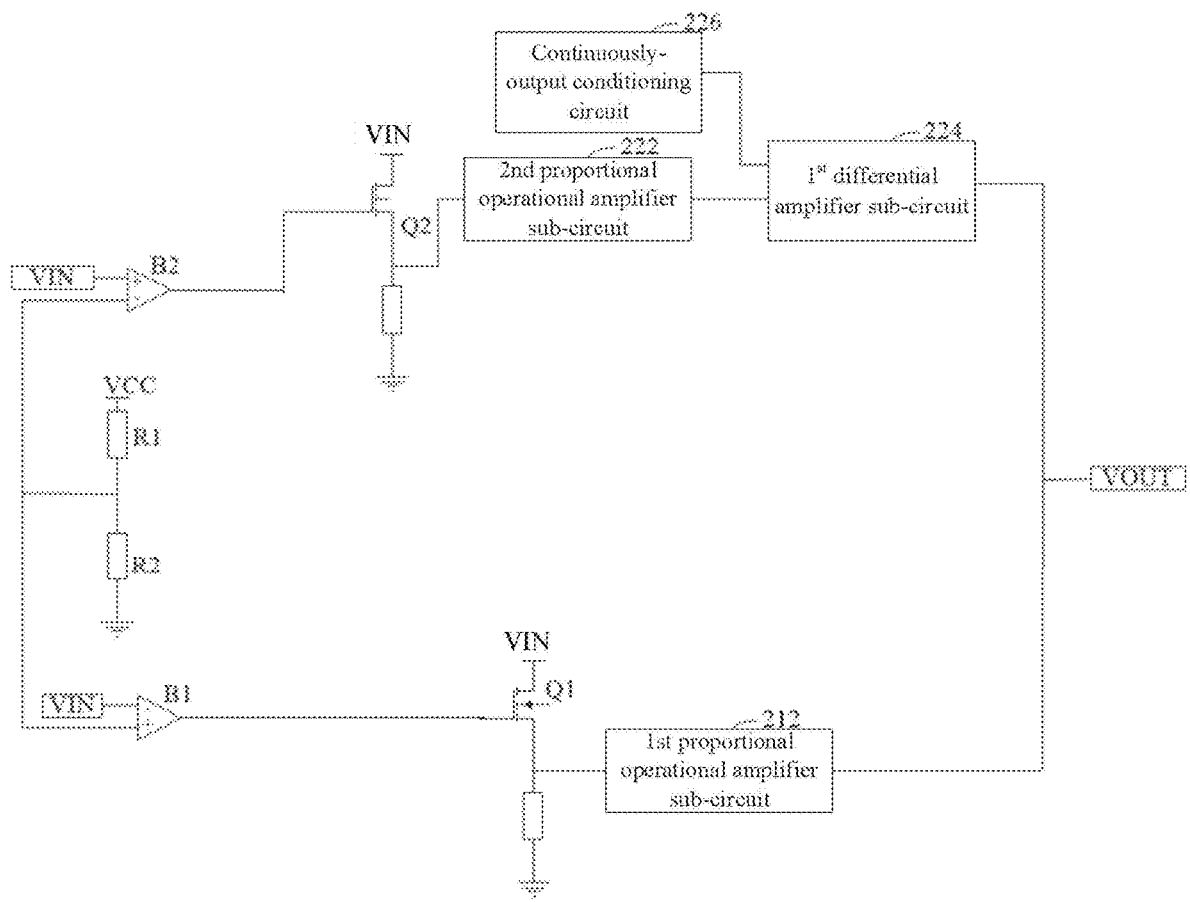
FIG. 4 is a fourth structural schematic view of a signal conditioning circuit according to an embodiment of the present disclosure.

In an example, as shown in FIG. 4, the first segmented voltage conditioning sub-circuit 210 includes a first switching tube Q1 and a first proportional operational amplifier sub-circuit 212. A gate of the first switching tube Q1 is connected to the output terminal of the first comparator B1, and a drain of the first switching tube Q1 is configured to access the input voltage signal. A source of the first switching tube Q1 is connected to an in-phase input terminal of the first proportional amplifier sub-circuit 212, an output terminal of the first proportional amplifier sub-circuit 212 is configured to output a first proportional amplified voltage signal.

The first proportional operational amplifier sub-circuit 212 is configured to amplify the input voltage signal in a first preset proportion. The first switching tube Q1 may be a MOS tube, for example, the first switching tube Q1 may be an N-type MOS tube.

When the voltage value VIN of the input voltage signal is less than the voltage threshold value VTH1 of the voltage threshold signal, the first comparator B1 outputs the high voltage level signal (i.e., the first conduction signal), and the gate of the first switching tube Q1 receives the first conduction signal, and therefore, the first switching tube Q1 is conducted. The drain of the first switching tube Q1 is configured to access the input voltage signal. The source of the first switching tube Q1 is connected to the in-phase input terminal of the first proportional operational amplifier sub-circuit 212. In this way, the in-phase input terminal of the first proportional operational amplifier sub-circuit 212 receives the input voltage signal, and the input voltage signal is amplified by the first proportional operational amplifier sub-circuit 212 based on the first preset proportion, such that the first proportional amplified voltage signal is output.

In an example, as shown in FIG. 4, the second segmented voltage conditioning sub-circuit 220 includes a second switching tube Q2, a second proportional amplifier sub-circuit 222, a first differential amplifier sub-circuit 224, and a continuously-output conditioning circuit 226. A gate of the second switching tube Q2 is connected to the output terminal of the second comparator B2, and a drain of the second switching tube Q2 is configured to access the input voltage signal VIN. A source of the second switching tube Q2 is connected to an in-phase input terminal of the second proportional amplifier sub-circuit 222, and an output terminal of the second proportional amplifier sub-circuit 222 is configured to transmit a second proportional amplified voltage signal to an in-phase input terminal of the first differential amplifier sub-circuit 224. An inverting input terminal of the first differential amplifier circuit 224 is connected to the continuously-output conditioning circuit 226. An output terminal of the first differential amplifier circuit 224 is configured to output the conditioned second proportional amplified voltage signal.

The second proportional operational amplifier sub-circuit 222 is configured to amplify the input voltage signal in a second preset proportion. The first differential amplifier sub-circuit 224 has circuit symmetry and may stabilize an operating point. The continuously-output conditioning circuit 226 is configured to condition an output voltage, such that the output voltage is continuous. For example, the continuously-output conditioning circuit 226 is configured to output a first continuously-output conditioned signal.

When the voltage value VIN of the input voltage signal is greater than the voltage threshold value VTH1 of the voltage threshold signal, the second comparator B2 outputs the high voltage level signal (i.e., the second conduction signal), and the gate of the second switching tube Q2 receives the second conduction signal, such that the second switching tube Q2 is conducted. The drain of the second switching tube Q2 is configured to access the input voltage signal VIN. The source of the second switching tube Q2 is connected to the in-phase input terminal of the second proportional amplifier sub-circuit 222. In this way, the in-phase input terminal of the second proportional amplifier sub-circuit 222 receives the input voltage signal, and the input voltage signal is amplified by the second proportional amplifier sub-circuit 222 based on the second preset proportion, such that the second proportional amplified voltage signal is input to the in-phase input terminal of the first differential amplifier sub-circuit 224. Since the inverting input terminal of the first differential amplifier sub-circuit 224 is connected to the first continuously-output conditioning circuit 226, the inverting input terminal of the first differential amplifier sub-circuit 224 is connected to the first continuously-output conditioned signal. A differential amplification process is performed on the first continuously-output conditioned signal, such that the output terminal of the first differential amplifier sub-circuit 224 outputs the conditioned second proportional amplified voltage signal.

In the present disclosure, the voltage signal conditioning is optimized. The voltage signal is automatically segmented and conditioned. Different gains may be applied for different segments of the voltage, the applicable sampling range of the voltage sample conditioning may be increased, sampling accuracy and universality may be improved, the scenarios that voltage sample conditioning can be applied may be increased, universality of the circuit and the accuracy of the sample conditioning may be improved, and a cost of the circuit may be reduced. By configuring the continuously-output conditioning circuit 226, the voltage may be output continuously, the scenarios that voltage sampling conditioning can be applied may be increased, and universality and accuracy of sampling conditioning of the circuit may be improved.

Figure 5:
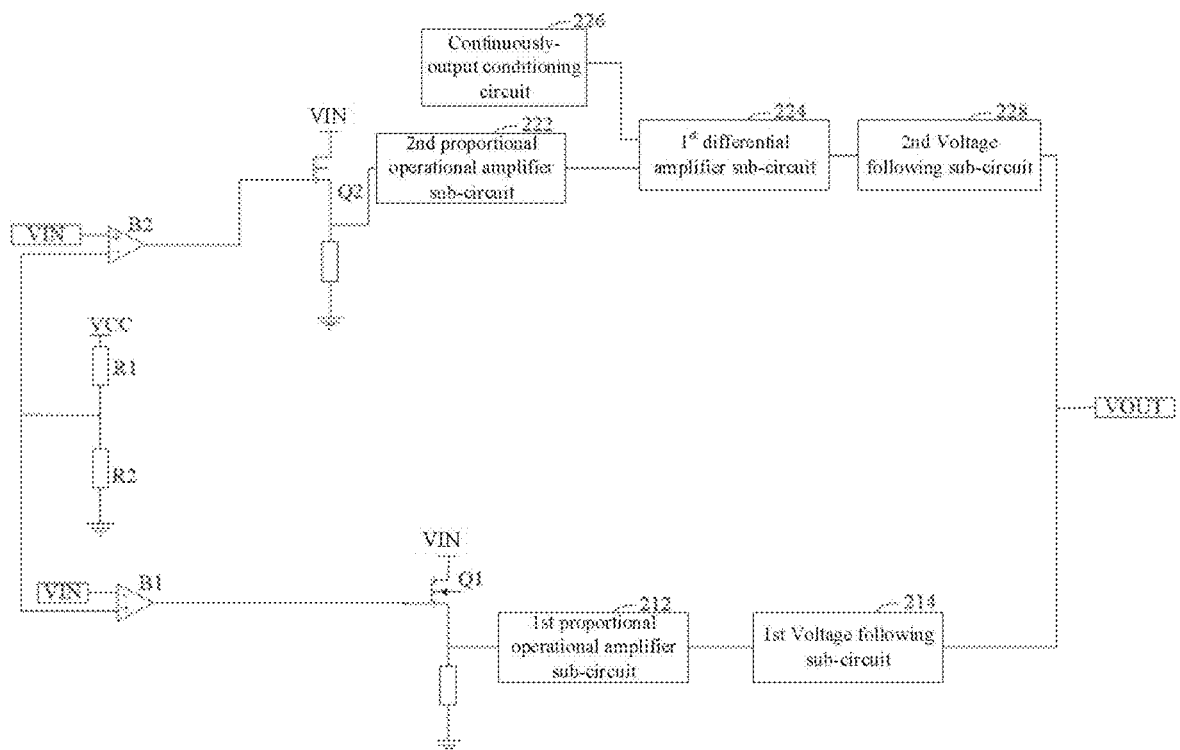
FIG. 5 is a fifth structural schematic view of a signal conditioning circuit according to an embodiment of the present disclosure.

In an example, as shown in FIG. 5, the first segment voltage conditioning sub-circuit 210 further includes a first voltage following sub-circuit 214. An in-phase input terminal of the first voltage following sub-circuit 214 is connected to the output terminal of the first proportional amplifier sub-circuit 212.

Since the in-phase input terminal of the first voltage following sub-circuit 214 is connected to the output terminal of the first proportional amplifier sub-circuit 212, the first voltage following sub-circuit 214 serves as a buffering isolation, such that the first proportional amplifier sub-circuit 212 and any circuit after the first proportional amplifier sub-circuit 212 do not affect each other, reliability of voltage signal conditioning may be improved.

In an example, as shown in FIG. 5, the second segmented voltage conditioning sub-circuit 220 further includes a second voltage following sub-circuit 228. An in-phase input terminal of the second voltage following sub-circuit 228 is connected to the output terminal of the first differential amplifier sub-circuit 224.

Since the in-phase input terminal of the second voltage following sub-circuit 228 is connected to the output terminal of the first differential amplifier sub-circuit 224, the first voltage following sub-circuit 214 serves as a buffering isolation, such that the first differential amplifier sub-circuit 224 and any circuit connected after the first differential amplifier sub-circuit 224 do not affect each other, and reliability of the voltage signal conditioning may be improved.

Figure 6:
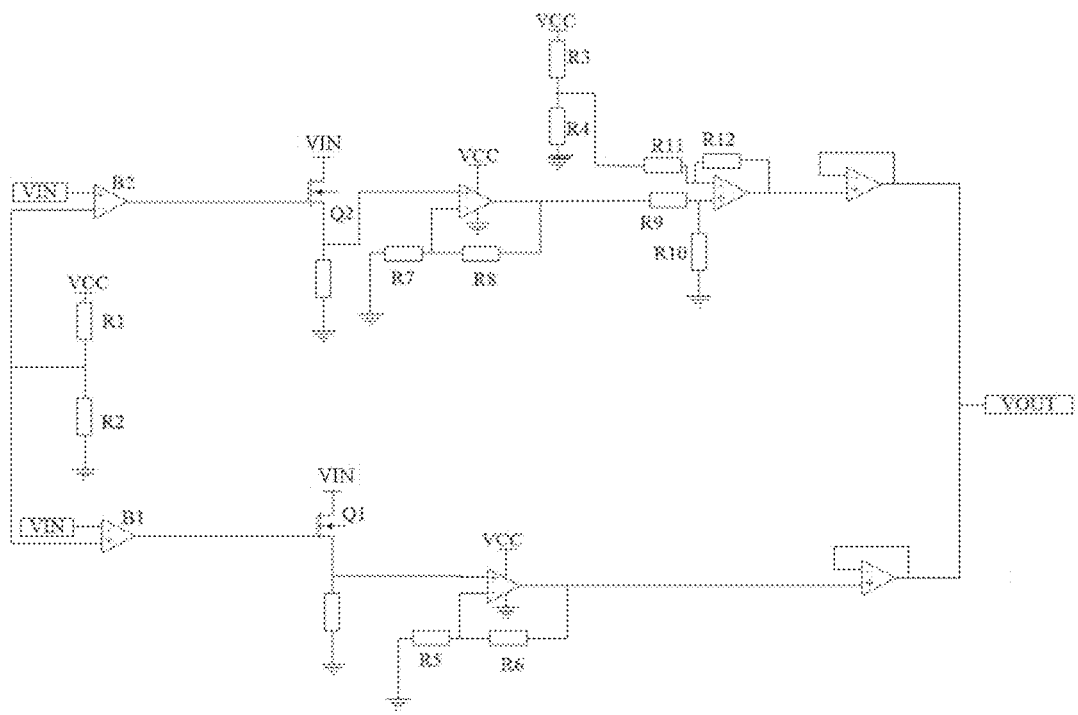
FIG. 6 is a sixth structural schematic view of a signal conditioning circuit according to an embodiment of the present disclosure.

In an example, as shown in FIG. 6, the first continuously-output conditioning circuit 226 includes a third resistor R3 and a fourth resistor R4. A first terminal of the third resistor R3 is connected to the direct current power supply. A second terminal of the third resistor R3 is connected to a first terminal of the fourth resistor R4. A second terminal of the fourth resistor R4 is connected to the ground. The inverting input terminal of the first differential amplifier sub-circuit 224 is connected between the second terminal of the third resistor R3 and the first terminal of the fourth resistor R4.

Due to the connection between the third resistor R3 and the fourth resistor R4, when a resistance value of the third resistor R3 is r3, a resistance value of the fourth resistor R4 is r4, and a voltage value of the direct current power supply VCC is vcc, a voltage conditioning value of the first continuously-output conditioning signal of the continuously-output conditioning circuit 226 is $$VTH2 = \frac{r4}{(r3 + r4)} * VCC.$$

Exemplarily, each of the third resistor R3 and the fourth resistor R4 may be an adjustable resistor.

In an example, as shown in FIG. 6, the voltage threshold sub-circuit includes the first resistor R1 and the second resistor R2. A resistance value of the first resistor R1 is r1. A resistance value of the second resistor R2 is r2. A resistance value of the third resistor R3 is r3. A resistance value of the fourth resistor R4 is r4. A voltage of the direct current power supply VCC is vcc.

By setting the resistance value r1 for the first resistor R1 and setting the resistance value r2 for the second resistor R2, the voltage threshold value VTH1 of the first voltage threshold signal is:

$$VTH1 = \frac{r2}{(r1 + r2)} VCC.$$

The selection circuit 300 compares the input voltage value VIN to the voltage threshold value VTH1 of the first voltage threshold signal. When VIN<VTH1, the first switching tube Q1 of the first voltage conditioning sub-circuit 210 is closed (connected), and the second switching tube Q2 is open (disconnected). In this case, the first voltage conditioning sub-circuit 210 is conducted and operating, and the second voltage conditioning sub-circuit 220 is open (disconnected) and is not operating. When VTH1<VIN, the second switching tube Q2 of the first voltage conditioning sub-circuit 210 is closed, the first switching tube Q1 is open. In this case, the second voltage conditioning sub-circuit 220 is open and is not operating.

In detail, as shown in FIG. 6, the first proportional operational amplifier sub-circuit 212 includes a first operational amplifier, a fifth resistor R5 (having a resistance value of r5), and a sixth resistor R6 (having a resistance value of r6). The second proportional operational amplifier sub-circuit 222 includes a second operational amplifier, a seventh resistor R7 (having a resistance value of r7), and an eighth resistor R8 (having a resistance value of r8). The first differential amplifier sub-circuit 224 includes a third operational amplifier, a ninth resistor R9 (having a resistance value of r9), a tenth resistor R10 (having a resistance value of HO), an eleventh resistor R11 (having a resistance value of r11), and a twelfth resistor R12 (having a resistance value of r12).

When VIN<VTH1, the first switching tube Q1 of the first voltage conditioning sub-circuit 210 is closed, and the second switching tube Q2 is open. In this case, the first voltage conditioning sub-circuit 210 is conducted and operating, and the second voltage conditioning sub-circuit 220 is disconnected and are not operating, such that the output voltage is $$VOUT = \left(1 + \frac{r6}{r5}\right)VIN.$$

To be noted that, the output voltage may be biased and proportionally amplified based on demands.

When VTH1<VIN, the second switching tube Q2 is closed, and the first switching tube Q1 is open. In this case, the second segment voltage conditioning sub-circuit 220 is conducted and operating, the first segment voltage conditioning sub-circuit 210 is disconnected and is not operating. When r9=r10=r11=r12, the output voltage is:

$$VOUT = \left(1 + \frac{r8}{r7}\right)VIN - VTH2.$$

In order to allow the voltage to be output continuously, the VTH2 voltage is set to be:

$$VTH2 = \left(1 + \frac{r8}{r7}\right)VIN - \left(1 + \frac{r6}{r5}\right)VIN = \frac{r4}{(r3+r4)} \times VCC.$$

Therefore, the output voltage is $$VOUT = \left(1 + \frac{r8}{r7}\right)VIN - \frac{r4}{(r3+r4)} \times VCC.$$

That is, the input votlage VIN is conditioned, and an output result of the conditioning is:

$$VOUT = \begin{cases} \left(1 + \frac{r6}{r5}\right)VIN, & VIN < VTH1 \\ \left(1 + \frac{r8}{r7}\right)VIN - \frac{r4}{(r3+r4)} \times VCC, & VIN > VTH1 \end{cases}.$$

In the above embodiments, the input voltage is divided into two ranges, and the input voltage signal is compared and processed. When the voltage value of the input voltage signal falls into a certain input voltage range, a voltage conditioning sub-circuit corresponding to the certain range (the first voltage conditioning sub-circuit and the second voltage conditioning sub-circuit) is conducted to condition the two-segmented voltage signal. In the present disclosure, the voltage signal conditioning is optimized, the voltage is automatically segmented and conditioned. The circuit may be flexibly adapted. Different gains may be applied for different segments of the voltage, the applicable sampling range of the voltage sample conditioning may be increased, sampling accuracy and universality may be improved, the scenarios that voltage sample conditioning can be applied may be increased, universality of the circuit and the accuracy of the sample conditioning may be improved, and a cost of the circuit may be reduced.

In an embodiment, a signal measurement device is provided. The signal measurement device includes a signal conditioning circuit as mentioned in any of the above embodiments.

Details of the signal conditioning circuit may refer to the description of the above embodiments, and will not be repeated here.

Technical features of the above embodiments may be combined in various ways. In order to provide a concise description, not all possible combinations of the technical features of the above embodiments are described. However, as long as a combination of technical features does not generate conflict, the combination shall be considered to be within the scope of the present disclosure.

The above described embodiments show only some embodiments of the present application, which are described in a more specific and detailed manner, but the description shall not be interpreted as limiting the scope of the present disclosure. To be noted that, for any ordinary skilled person in the art, various variations and improvements may be made without departing from the concept of the present disclosure, and the variations and improvements shall fall within the scope of the present disclosure. Therefore, the scope of the present disclosure shall be governed by the attached claims.

What is claimed is:

1. A signal conditioning circuit, comprising:
a voltage threshold circuit, configured to output a voltage threshold signal;
a selection circuit, connected to the voltage threshold circuit; wherein the selection circuit is configured to receive an input voltage signal and the voltage threshold signal, output a first conduction signal in response to a voltage value of the input voltage signal is less than a threshold value of the voltage threshold signal, and output a second conduction signal in response to the voltage value of the input voltage signal is greater than the threshold value of the voltage threshold signal; and
a segmented voltage conditioning circuit, connected to the selection circuit and configured to receive the input voltage signal, the first conduction signal and the second conduction signal; wherein the segmented voltage conditioning circuit comprises a first segmented voltage conditioning sub-circuit and a second segmented voltage conditioning sub-circuit, the first segmented voltage conditioning sub-circuit being configured to condition the input voltage signal to output a first output voltage signal based on the first conduction signal, and the second segmented voltage conditioning sub-circuit being configured to condition the input voltage signal to output a second output voltage signal based on the second conduction signal.

2. The signal conditioning circuit according to claim 1, wherein
the first segmented voltage conditioning sub-circuit comprises a first switching tube and a first proportional operational amplifier sub-circuit, wherein a gate of the first switching tube is connected to the selection circuit, a source of the first switching tube is connected to an input terminal of the first proportional operational amplifier sub-circuit, and an output terminal of the first proportional operational amplifier sub-circuit is configured to output a first proportional amplified voltage signal;
the second segmented voltage conditioning sub-circuit comprises a second switching tube and a second proportional operational amplifier sub-circuit, wherein a gate of the second switching tube is connected to the selection circuit, a source of the second switching tube is connected to an input terminal of the second proportional operational amplifier sub-circuit, and an output terminal of the second proportional operational amplifier sub-circuit is configured to output a second proportional amplified voltage signal.

3. The signal conditioning circuit according to claim 2, wherein the second segmented voltage conditioning sub-circuit further comprises a differential amplifier sub-circuit and a continuously-output conditioning circuit, wherein a first input terminal of the differential amplifier sub-circuit is connected to the output terminal of the second proportional operational amplifier sub-circuit, a second input terminal of the differential amplifier sub-circuit is connected to the continuously-output conditioning circuit, and an output terminal of the differential amplifier sub-circuit is configured to output a conditioned second proportional amplification voltage signal which is obtained as the second proportional amplification voltage signal is conditioned.

4. The signal conditioning circuit according to claim 3, wherein the first proportional operational amplifier sub-circuit comprises a first proportional operational amplifier, a fifth resistor, and a sixth resistor, wherein a positive input terminal of the first proportional operational amplifier is used as the input terminal of the first proportional operational amplifier sub-circuit, a negative input terminal of the first proportional operational amplifier is connected to one terminal of the fifth resistor and one terminal of the sixth resistor, another terminal of the fifth resistor is grounded, and another terminal of the sixth resistor is connected to an output terminal of the first proportional operational amplifier;

the second proportional operational amplifier sub-circuit comprises a second proportional operational amplifier, a seventh resistor, and an eighth resistor, wherein a positive input terminal of the second proportional operational amplifier is used as the input terminal of the second proportional operational amplifier sub-circuit, a negative input terminal of the second proportional operational amplifier is connected to one terminal of the seventh resistor and one terminal of the eighth resistor, another terminal of the seventh resistor is grounded, and another terminal of the eighth resistor is connected to an output terminal of the second proportional operational amplifier.

5. The signal conditioning circuit according to claim 3, wherein the continuously-output conditioning circuit comprises a third resistor and a fourth resistor which are series-connected, one end of the series-connected third resistor and the fourth resistor is connected to a DC power supply and another end of the series-connected third resistor and the fourth resistor is grounded;

the differential amplifier sub-circuit comprises a differential amplifier, a ninth resistor, a tenth resistor, an eleventh resistor, and a twelfth resistor, wherein a positive input terminal of the differential amplifier is connected to one terminal of the ninth resistor and one terminal of the tenth resistor, another terminal of the ninth resistor is connected to the output terminal of the second proportional operational amplifier sub-circuit, another terminal of the tenth resistor is grounded, a negative input terminal of the differential amplifier is connected to one terminal of the eleventh resistor and one terminal of the twelfth resistor, another terminal of the eleventh resistor is connected between the third resistor and the fourth resistor, and another terminal of the twelfth resistor is connected to an output terminal of the differential amplifier.

6. The signal conditioning circuit according to claim 5, wherein the ninth resistor, the tenth resistor, the eleventh resistor, and the twelfth resistor have the same resistor value.

7. The signal conditioning circuit according to claim 2, wherein the first segmented voltage conditioning sub-circuit further comprises a first voltage following sub-circuit, wherein a positive input terminal of the first voltage following sub-circuit is connected to the output terminal of the first proportional operational amplifier sub-circuit, and a negative input terminal of the first voltage following sub-circuit is connected to the output terminal of the first voltage following sub-circuit;

the second segmented voltage conditioning sub-circuit further comprises a second voltage following sub-circuit, wherein a positive input terminal of the second voltage following sub-circuit is connected to the output terminal of the second proportional operational amplifier sub-circuit, and a negative input terminal of the second voltage following sub-circuit is connected to the output terminal of the second voltage following sub-circuit.

8. The signal conditioning circuit according to claim 1, wherein the voltage threshold circuit comprises a first resistor and a second resistor which are series-connected, wherein one end of the series-connected first resistor and the second resistor is connected to a DC power supply and another end of the series-connected first resistor and the second resistor is grounded.

9. The signal conditioning circuit according to claim 8, wherein the selection circuit comprises a first comparator and a second comparator;

wherein a first input terminal of the first comparator is used to receive the input voltage signal, a second input terminal of the first comparator is connected to the voltage threshold circuit to receive the voltage threshold signal, an output terminal of the first comparator is connected to the first segmented voltage conditioning sub-circuit;

a first input terminal of the second comparator is connected to the voltage threshold circuit to receive the voltage threshold signal, a second input terminal of the second comparator is used to receive the input voltage signal, and an output terminal of the second comparator is connected to the second segmented voltage conditioning sub-circuit.

10. A signal measurement device, comprising:
a signal conditioning circuit, comprising:
a voltage threshold circuit, configured to output a voltage threshold signal;
a selection circuit, connected to the voltage threshold circuit; wherein the selection circuit is configured to receive an input voltage signal and the voltage threshold signal, output a first conduction signal in response to a voltage value of the input voltage signal is less than a threshold value of the voltage threshold signal, and output a second conduction signal in response to the voltage value of the input voltage signal is greater than the threshold value of the voltage threshold signal; and
a segmented voltage conditioning circuit, connected to the selection circuit and configured to receive the input voltage signal, the first conduction signal and the second conduction signal; wherein the segmented voltage conditioning circuit comprises a first segmented voltage conditioning sub-circuit and a second segmented voltage conditioning sub-circuit, the first segmented voltage conditioning sub-circuit being configured to condition the input voltage signal to output a first output voltage signal based on the first conduction signal, and the second segmented voltage conditioning sub-circuit being configured to condition the input voltage signal to output a second output voltage signal based on the second conduction signal.

11. The signal measurement device according to claim 10, wherein
the first segmented voltage conditioning sub-circuit comprises a first switching tube and a first proportional operational amplifier sub-circuit, wherein a gate of the first switching tube is connected to the selection circuit, a source of the first switching tube is connected to an input terminal of the first proportional operational amplifier sub-circuit, and an output terminal of the first proportional operational amplifier sub-circuit is configured to output a first proportional amplified voltage signal;
the second segmented voltage conditioning sub-circuit comprises a second switching tube and a second proportional operational amplifier sub-circuit, wherein a gate of the second switching tube is connected to the selection circuit, a source of the second switching tube is connected to an input terminal of the second proportional operational amplifier sub-circuit, and an output terminal of the second proportional operational amplifier sub-circuit is configured to output a second proportional amplified voltage signal.

12. The signal measurement device according to claim 11, wherein the second segmented voltage conditioning sub-circuit further comprises a differential amplifier sub-circuit and a continuously-output conditioning circuit, wherein a first input terminal of the differential amplifier sub-circuit is connected to the output terminal of the second proportional operational amplifier sub-circuit, a second input terminal of the differential amplifier sub-circuit is connected to the continuously-output conditioning circuit, and an output terminal of the differential amplifier sub-circuit is configured to output a conditioned second proportional amplification voltage signal which is obtained as the second proportional amplification voltage signal is conditioned.

13. The signal measurement device according to claim 12, wherein the first proportional operational amplifier sub-circuit comprises a first proportional operational amplifier, a fifth resistor, and a sixth resistor, wherein a positive input terminal of the first proportional operational amplifier is used as the input terminal of the first proportional operational amplifier sub-circuit, a negative input terminal of the first proportional operational amplifier is connected to one terminal of the fifth resistor and one terminal of the sixth resistor, another terminal of the fifth resistor is grounded, and another terminal of the sixth resistor is connected to an output terminal of the first proportional operational amplifier;
the second proportional operational amplifier sub-circuit comprises a second proportional operational amplifier, a seventh resistor, and an eighth resistor, wherein a positive input terminal of the second proportional operational amplifier is used as the input terminal of the second proportional operational amplifier sub-circuit, a negative input terminal of the second proportional operational amplifier is connected to one terminal of the seventh resistor and one terminal of the eighth resistor, another terminal of the seventh resistor is grounded, and another terminal of the eighth resistor is connected to an output terminal of the second proportional operational amplifier.

14. The signal measurement device according to claim 12, wherein
the continuously-output conditioning circuit comprises a third resistor and a fourth resistor which are series-connected, one end of the series-connected third resistor and the fourth resistor is connected to a DC power supply and another end of the series-connected third resistor and the fourth resistor is grounded;
the differential amplifier sub-circuit comprises a differential amplifier, a ninth resistor, a tenth resistor, an eleventh resistor, and a twelfth resistor, wherein a positive input terminal of the differential amplifier is connected to one terminal of the ninth resistor and one terminal of the tenth resistor, another terminal of the ninth resistor is connected to the output terminal of the second proportional operational amplifier sub-circuit, another terminal of the tenth resistor is grounded, a negative input terminal of the differential amplifier is connected to one terminal of the eleventh resistor and one terminal of the twelfth resistor, another terminal of the eleventh resistor is connected between the third resistor and the fourth resistor, and another terminal of the twelfth resistor is connected to an output terminal of the differential amplifier.

15. The signal measurement device according to claim 14, wherein the ninth resistor, the tenth resistor, the eleventh resistor, and the twelfth resistor have the same resistor value.

16. The signal measurement device according to claim 11, wherein
the first segmented voltage conditioning sub-circuit further comprises a first voltage following sub-circuit, wherein a positive input terminal of the first voltage following sub-circuit is connected to the output terminal of the first proportional operational amplifier sub-circuit, and a negative input terminal of the first voltage following sub-circuit is connected to the output terminal of the first voltage following sub-circuit;
the second segmented voltage conditioning sub-circuit further comprises a second voltage following sub-circuit, wherein a positive input terminal of the second voltage following sub-circuit is connected to the output terminal of the second proportional operational amplifier sub-circuit, and a negative input terminal of the second voltage following sub-circuit is connected to the output terminal of the second voltage following sub-circuit.

17. The signal measurement device according to claim 10, wherein the voltage threshold circuit comprises a first resistor and a second resistor which are series-connected, wherein one end of the series-connected first resistor and the second resistor is connected to a DC power supply and another end of the series-connected first resistor and the second resistor is grounded.

18. The signal measurement device according to claim 17, wherein the selection circuit comprises a first comparator and a second comparator;
wherein a first input terminal of the first comparator is used to receive the input voltage signal, a second input terminal of the first comparator is connected to the voltage threshold circuit to receive the voltage threshold signal, an output terminal of the first comparator is connected to the first segmented voltage conditioning sub-circuit;
a first input terminal of the second comparator is connected to the voltage threshold circuit to receive the voltage threshold signal, a second input terminal of the second comparator is used to receive the input voltage signal, and an output terminal of the second comparator is connected to the second segmented voltage conditioning sub-circuit.

19. A signal conditioning circuit, comprising:
a voltage threshold circuit, configured to output a voltage threshold signal;
a selection circuit, connected to the voltage threshold circuit and configured to receive an input voltage signal and the voltage threshold signal, output a first conduction signal in response to a voltage value of the input voltage signal is less than a threshold value of the voltage threshold signal, and output a second conduction signal in response to the voltage value of the input voltage signal is greater than the threshold value of the voltage threshold signal;
a first segmented voltage conditioning sub-circuit, configured to condition the input voltage signal to output a first output voltage signal based on the first conduction signal; and
a second segmented voltage conditioning sub-circuit, configured to condition the input voltage signal to output a second output voltage signal based on the second conduction signal.

20. The signal conditioning circuit according to claim 19, wherein
the first segmented voltage conditioning circuit comprises a first switching tube and a first proportional operational amplifier sub-circuit, wherein a gate of the first switching tube is connected to the selection circuit, a source of the first switching tube is connected to an input terminal of the first proportional operational amplifier sub-circuit, and an output terminal of the first proportional operational amplifier sub-circuit is configured to output a first proportional amplified voltage signal;
the second segmented voltage conditioning circuit comprises a second switching tube and a second proportional operational amplifier sub-circuit, wherein a gate of the second switching tube is connected to the selection circuit, a source of the second switching tube is connected to an input terminal of the second proportional operational amplifier sub-circuit, and an output terminal of the second proportional operational amplifier sub-circuit is configured to output a second proportional amplified voltage signal.

* * * * *